US008686571B2

(12) United States Patent
Huang et al.

(10) Patent No.: US 8,686,571 B2
(45) Date of Patent: Apr. 1, 2014

(54) BONDING LAYER STRUCTURE AND METHOD FOR WAFER TO WAFER BONDING

(75) Inventors: Hsin-Ting Huang, Bade (TW); Jung-Huei Peng, Jhubei (TW); Shang-Ying Tsai, Pingzhen (TW); Li-Min Hung, Longtan Township (TW); Yao-Te Huang, Hsin-Chu (TW); Yi-Chuan Teng, Zhubei (TW); Chin-Yi Cho, Kaohsiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/571,260

(22) Filed: Aug. 9, 2012

(65) Prior Publication Data

US 2014/0042625 A1    Feb. 13, 2014

(51) Int. Cl.
*H01L 33/00* (2010.01)
*H01L 23/48* (2006.01)

(52) U.S. Cl.
USPC ............ 257/777; 257/E51.022; 257/E51.018; 257/E33.001; 257/E33.077; 257/E33.054; 257/E25.032; 257/E25.028; 257/E23.023; 257/E21.575; 257/686; 257/723; 257/700; 257/701; 257/758; 257/70; 257/24; 257/80; 257/85; 257/100; 257/101

(58) Field of Classification Search
USPC .......... 257/79, 13, 80, 85, 89, 100, 101, 102, 257/E51.018, E51.022, E33.001, E33.077, 257/E33.054, E25.032, E25.028, 777, 686, 257/723, E23.023, E21.575, E21.127, 700, 257/701, 758
See application file for complete search history.

(56) References Cited

U.S. PATENT DOCUMENTS

| 5,013,681 | A  | * | 5/1991 | Godbey et al. | 438/459 |
| 7,279,369 | B2 | * | 10/2007 | Lei et al. | 438/149 |
| 7,553,743 | B2 | * | 6/2009 | Lee | 438/459 |
| 7,554,124 | B2 | * | 6/2009 | Hata | 257/79 |
| 8,299,501 | B2 | * | 10/2012 | Watanabe et al. | 257/200 |
| 2012/0074590 | A1 | * | 3/2012 | Lin et al. | 257/777 |

\* cited by examiner

*Primary Examiner* — Alexander Oscar Williams
(74) *Attorney, Agent, or Firm* — Slater & Matsil, L.L.P.

(57) ABSTRACT

A structure comprises a first semiconductor substrate, a first bonding layer deposited on a bonding side the first semiconductor substrate, a second semiconductor substrate stacked on top of the first semiconductor substrate and a second bonding layer deposited on a bonding side of the second semiconductor substrate, wherein the first bonding layer is of a horizontal length greater than a horizontal length of the second semiconductor substrate, and wherein there is a gap between an edge of the second bonding layer and a corresponding edge of the second semiconductor substrate.

14 Claims, 3 Drawing Sheets

BONDING LAYER STRUCTURE AND METHOD FOR WAFER TO WAFER BONDING

BACKGROUND

The semiconductor industry has experienced rapid growth due to improvements in the integration density of a variety of electronic components (e.g., transistors, diodes, resistors, capacitors, etc.). For the most part, this improvement in integration density has come from shrinking the semiconductor process node (e.g., shrink the process node towards the sub-20 nm node). As the demand for miniaturization, higher speed and greater bandwidth, as well as lower power consumption and latency has grown recently, there has grown a need for smaller and more creative packaging techniques of semiconductor dies.

As semiconductor technologies evolve, multiple chip wafer level package based semiconductor devices have emerged as an effective alternative to further reduce the physical size of a semiconductor chip. In a wafer level package based semiconductor device, active circuits such as logic, memory, processor circuits and the like are fabricated on different wafers and each wafer die is stacked on top of another wafer die using pick-and-place techniques. Much higher density can be achieved by employing multiple chip semiconductor devices. Furthermore, multiple chip semiconductor devices can achieve smaller form factors, cost-effectiveness, increased performance and lower power consumption.

A multiple chip integrated circuit (IC) may comprise a top active circuit layer, a bottom active circuit layer and a plurality of inter-layers. Two dies may be bonded together through suitable bonding techniques. The commonly used bonding techniques include direct bonding, chemically activated bonding, plasma activated bonding, anodic bonding, eutectic bonding, glass frit bonding, adhesive bonding, thermo-compressive bonding, reactive bonding and the like.

Eutectic bonding is a commonly used low temperature bonding technique for semiconductor vertical integration. During a eutectic bonding process, eutectic bonding materials such as aluminum, germanium and the like are deposited on the bonding sides of two wafers respectively through a suitable deposition process such as sputtering. One wafer is stacked on top of another wafer. The stacked wafers are placed in a chamber. The chamber temperature is elevated to a level, at which a eutectic reaction occurs and a eutectic alloy is generated between two wafers. Such a eutectic alloy not only generates a reliable bond between two wafers, but also provides a conductive channel between two wafers.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to embodiments in a specific context, namely an apparatus and method for reducing spherical beads in a eutectic bonding process. The embodiments of the disclosure may also be applied, however, to a variety of bonding processes for semiconductor vertical integration. Hereinafter, various embodiments will be explained in detail with reference to the accompanying drawings.

Figure 1:
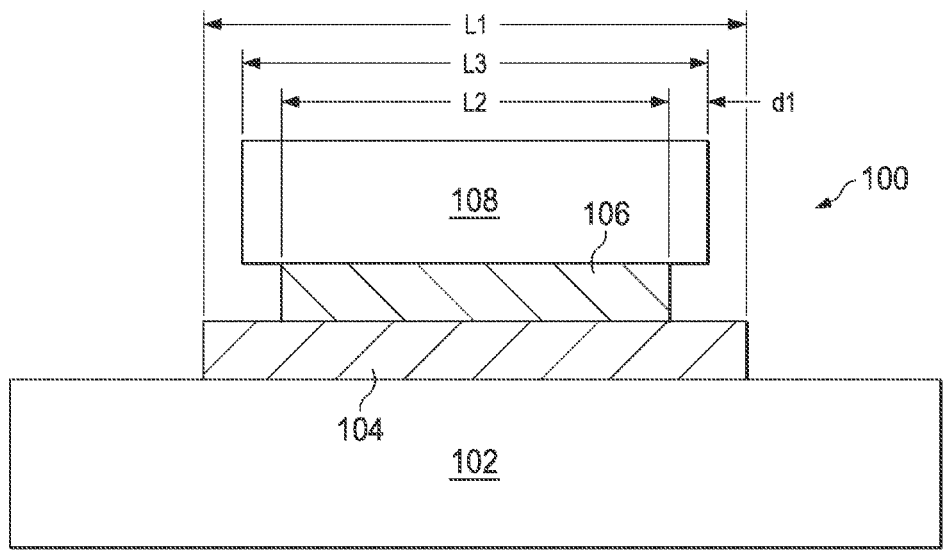
FIG. 1 illustrates a cross sectional view of a three dimensional integrated circuit in accordance with an embodiment.

FIG. 1 illustrates a cross sectional view of a three dimensional integrated circuit in accordance with an embodiment. The three dimensional integrated circuit 100 includes a first semiconductor substrate 102 and a second semiconductor substrate 108. As shown in FIG. 1, the second semiconductor substrate 108 is stacked on top of the first semiconductor substrate 102. There may be two bonding layers 104 and 106 formed between the second semiconductor substrate 108 and the first semiconductor substrate 102. The first bonding layer 104 is formed on a bonding side of the first semiconductor substrate 102. Likewise, the second bonding layer 106 is formed on a bonding side of the second semiconductor substrate 108.

As shown in FIG. 1, the horizontal length of the first bonding layer 104 is defined as L1. The horizontal length of the second bonding layer 106 is defined as L2. The horizontal length of the second semiconductor substrate 108 is defined as L3. There is a gap between the right edge of the second bonding layer 106 and the right edge of the second semiconductor substrate 108. The length of the gap is defined as d1. In accordance with an embodiment, L1 is in a range from about 11 um to about 200 um. L2 is in a range from about 10 um to about 199 um. L1 is greater than L3 by a percentage in a range from about 20% to about 40%. The gap d1 is less than 10 um.

As shown in FIG. 1, the horizontal length of the first bonding layer 104 is greater than the horizontal length of the semiconductor substrate 108 from the cross sectional view. In other words, the exterior edges of the second semiconductor substrate 108 are within the exterior edges of the first bonding layer 104. One advantageous feature of having a larger first bonding layer is that during a eutectic bonding process, the larger first bonding layer provides extra space for the majority of the spherical beads generated from the eutectic process. As a result, the majority of the spherical beads may not roll into the top surface of the first semiconductor substrate 102. The detailed process will discussed below with respect to FIG. 2.

In sum, the stacked structure shown in FIG. 1 is of the following relationships. The horizontal length of the first semiconductor substrate 102 is greater than the horizontal length of the first bonding layer 104. The horizontal length of the first bonding layer 104 is greater than the horizontal length of the second semiconductor substrate 108. The horizontal length of the second semiconductor substrate 108 is greater than the horizontal length of the second bonding layer 106.

The first bonding layer 104 may be formed on the first semiconductor substrate 102 through suitable deposition techniques such as chemical vapor deposition (CVD), Physical Vapor Deposition (PVD) and lithography. In accordance with an embodiment, the first bonding layer 104 may be formed of aluminum. Alternatively, the first bonding layer 104 may be formed of an aluminum alloy, wherein aluminum is a predominant metal. In accordance with an embodiment, the first bonding layer 104 may include about 0.5 percent alloying element such as copper and about 99.5 percent aluminum. It should be noted that the first bonding layer 104 may be a portion of the interconnect structure of the first substrate 102. In other words, the first bonding layer 104 may include a variety of metal lines, which are coupled to active circuits of the first semiconductor substrate 102 through a plurality of vias.

The second bonding layer 106 may be formed on the second semiconductor substrate 108 through suitable deposition techniques such as Physical Vapor Deposition (PVD) and lithography. In accordance with an embodiment, the second bonding layer 106 is formed of germanium. Alternatively, the second bonding layer 106 may be formed of indium, gold, tin and the like. It should be noted that the bonding materials of the first bonding layer and the second bonding layer are so selected that the bonding process may be performed at a lower eutectic point. For example, the first bonding layer may comprise aluminum, and the second bonding layer may comprise germanium. Alternatively, the first bonding layer may comprise aluminum, and the second bonding layer may comprise gold. Furthermore, the first bonding layer may comprise tin, and the second bonding layer may comprise gold.

It should further be noted while FIG. 1 shows both the first bonding layer 104 and the second bonding layer 106 are a single layer, the bonding layers 104 and 106 may be a composition layer including two or more layers. For example, the second bonding layer 106 may be a composition layer formed by a plurality of layers selected from germanium layers, indium layers, gold layers and tin layers.

The first semiconductor substrate 102 may include a variety of semiconductor devices such as complementary metal oxide semiconductor (CMOS) logic circuits, a CMOS imaging sensor, a micro-electro-mechanical system (MEMS) device and the like. The first semiconductor substrate 102 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, typically a silicon substrate or a glass substrate. Other substrates, such as multi-layered or gradient substrates may also be used.

The electrical circuits (not shown) formed in the first semiconductor substrate 102 may be any type of circuitry suitable for a particular application. In an embodiment, the circuitry includes electrical devices formed on and in the substrate with one or more dielectric layers overlying the electrical devices. Metal layers may be formed between dielectric layers to route electrical signals between the electrical devices. Electrical devices may also be formed in one or more dielectric layers.

For example, the electrical circuits may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, or the like. One of ordinary skill in the art will appreciate that the above examples are provided for illustrative purposes only to further explain applications of the present invention and are not meant to limit the present invention in any manner. Other circuitry may be used as appropriate for a given application.

The second semiconductor substrate 108 may include a variety of semiconductor devices. In particular, the second semiconductor substrate 108 may be a cap substrate of a MEMS device in accordance with an embodiment. The structure of the second semiconductor substrate 108 may be similar to that of the first semiconductor substrate 102, and hence is not discussed herein again.

Figure 2:
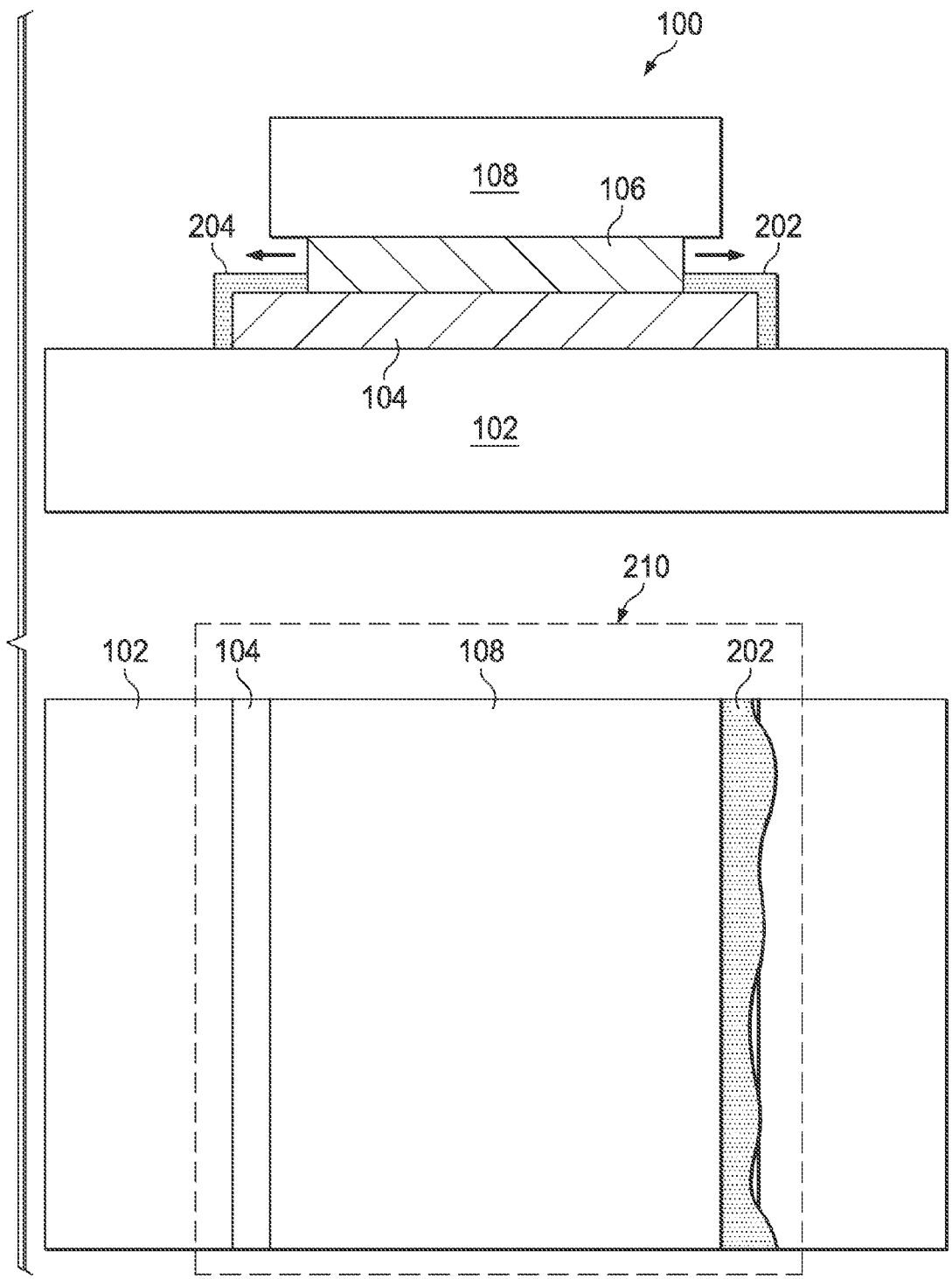
FIG. 2 illustrates a cross sectional view of a three dimensional integrated circuit after a eutectic bonding process is applied to the three dimensional integrated circuit in accordance with an embodiment.

FIG. 2 illustrates a cross sectional view of a three dimensional integrated circuit after a eutectic bonding process is applied to the three dimensional integrated circuit in accordance with an embodiment. The structure of the three dimensional integrated circuit 100 has been described above in detail with respect to FIG. 1, and hence is not discussed again to avoid repetition. After an eutectic bonding process is applied to the three dimensional integrated circuit 100, the bonding material (e.g., AlCu) of the first bonding layer 104 reacts with the bonding material (e.g., germanium) of the second bonding layer 106. As a result, the reaction between two bonding materials helps to form a solid bond between two semiconductor substrates 102 and 108.

At the same time, there may be a plurality of spherical beads generated from the reaction between two bonding layers 104 and 106. The spherical beads may be spread out adjacent to the interface between the first bonding layer 104 and the second bonding layer 106. In particular, as shown in FIG. 2, spherical beads 202 and 204 may be spread out on the exposed surface of the first bonding layer 104. Moreover, some spherical beads 202 and 204 may overflow down the edges of the first bonding layer 104.

A top view of a portion of the three dimensional integrated circuit 100 illustrates in detail the overflow of the spherical beads 202. As shown in the top view 210, the majority of the spherical beads 202 may stay on top of the first bonding layer 104. However, a small percentage of the spherical beads 202 may overflow down the edge of the first bonding layer 104. One advantageous feature of having a larger first bonding layer 104 is that such a larger first bonding layer 104 shown in FIG. 2 helps to prevent the majority of the spherical beads from overflowing down the edges of the first bonding layer 104. Reducing percentage of the spherical beads on the top surface of the first semiconductor substrate 102 may help to improve the reliability of the three dimensional integrated circuit 100.

Figure 3:
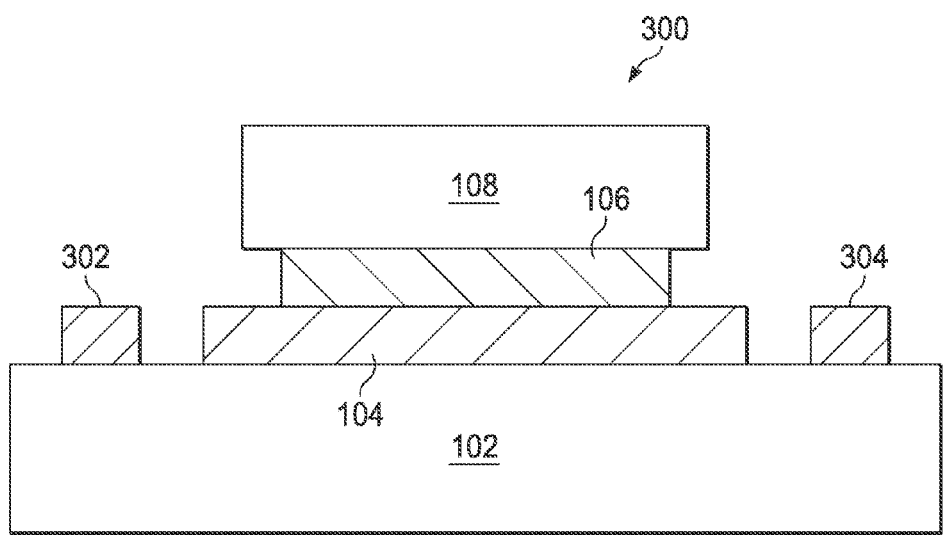
FIG. 3 illustrates a cross sectional view of a three dimensional integrated circuit in accordance with another embodiment.

FIG. 3 illustrates a cross sectional view of a three dimensional integrated circuit in accordance with another embodiment. The structure of the three dimensional integrated circuit 300 is similar to that of the three dimensional integrated circuit 100 shown in FIG. 1 except that barrier layers 302 and 304 may function as two barrier walls to prevent the spherical beads (not shown but illustrated in FIG. 4) from rolling into the critical surface portion of the first semiconductor substrate 102.

In accordance with some embodiments, the barrier layers 302 and 304 may be formed of the same material as the first bonding layer 104. In particular, the barrier layers 302 and 304 may be formed in the same fabrication steps (e.g., CVD, PVD and lithography) as the first bonding layer 104. It should be noted while FIG. 3 illustrates two separated barrier layers 302 and 304, the barrier layers 302 and 304 may be portions of a continuous barrier layer.

Figure 4:
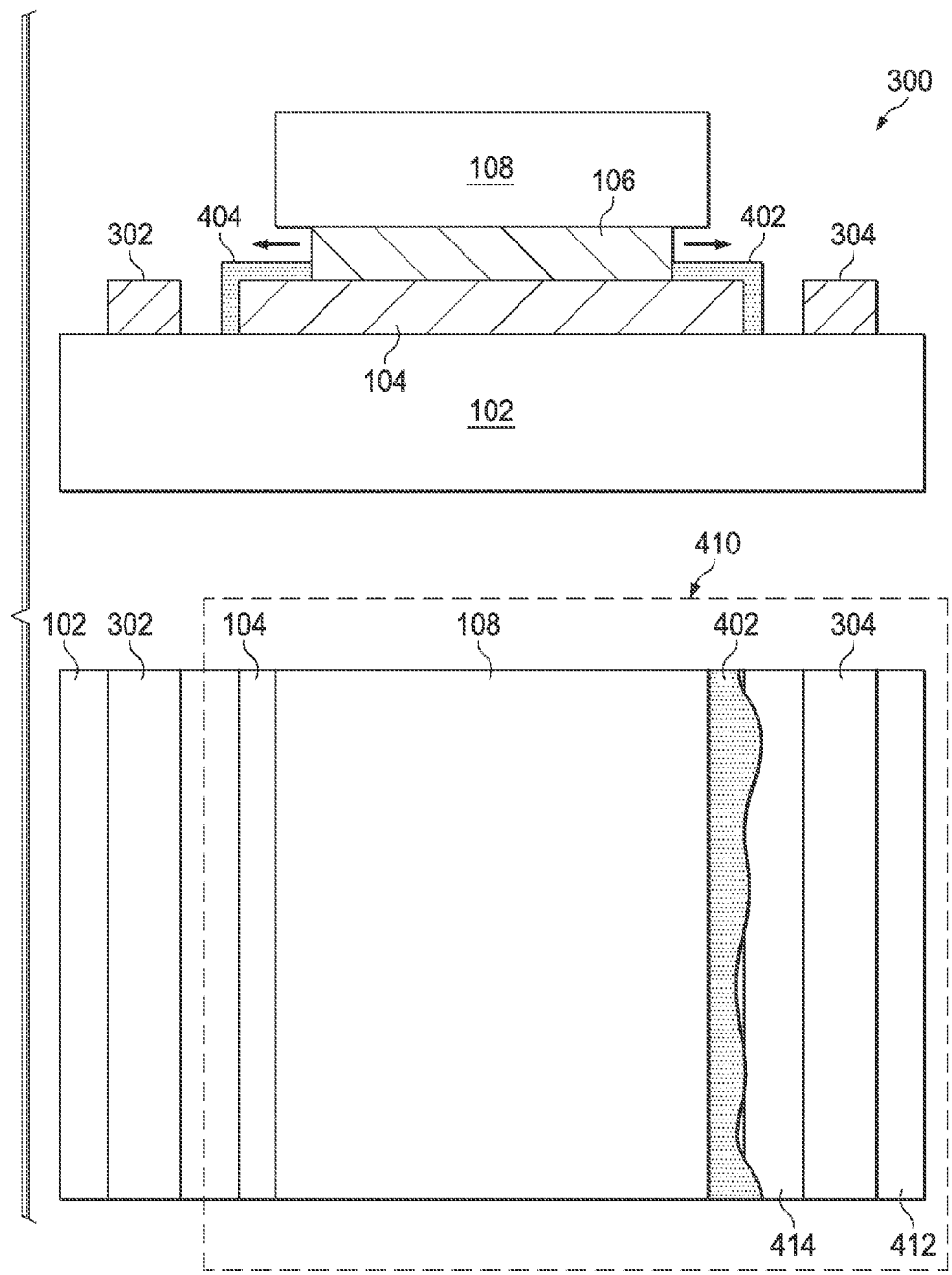
FIG. 4 illustrates a cross sectional view of a three dimensional integrated circuit shown in FIG. 3 after a eutectic bonding process is applied to the three dimensional integrated circuit in accordance with an embodiment.

FIG. 4 illustrates a cross sectional view of a three dimensional integrated circuit shown in FIG. 3 after a eutectic bonding process is applied to the three dimensional integrated circuit in accordance with an embodiment. The overflow prevention mechanism shown in FIG. 4 is similar to that shown in FIG. 2 except that barrier layers 302 and 304 are employed to prevent the spherical beads 402 and 404 from rolling into the top surface of the first semiconductor substrate 102. In particular, some portions (e.g., semiconductor region 414) of the top surface of the first semiconductor substrate 102 are not sensitive to spherical beads. On the other hand, some portions (e.g., semiconductor region 412) of the top surface of the first semiconductor substrate 102 are sensitive to spherical beads. Barrier layers 302 and 304 may be used to block the spherical beads from rolling into the top surface regions (e.g., semiconductor region 412) vulnerable to the overflow of the spherical beads.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An apparatus comprising:
a first semiconductor substrate;
a first bonding layer deposited on a bonding side of the first semiconductor substrate, wherein there is a gap between an edge of the first bonding layer and an edge of the first semiconductor substrate;
a second semiconductor substrate stacked on top of the first semiconductor substrate; and
a second bonding layer deposited on a bonding side of the second semiconductor substrate, wherein the first bonding layer is of a first horizontal dimension greater than a fourth horizontal dimension of the second semiconductor substrate, and wherein there is a gap between an edge of the second bonding layer and a corresponding edge of the second semiconductor substrate.

2. The apparatus of claim 1, further comprising:
a barrier layer formed on the first semiconductor substrate, wherein the barrier layer is formed of a same material as the first bonding layer.

3. The apparatus of claim 1, wherein:
the first bonding layer is formed of an aluminum alloy.

4. The apparatus of claim 1, wherein:
the second bonding layer is formed of germanium.

5. The apparatus of claim 1, wherein:
the gap is of a length less than 10 um.

6. The apparatus of claim 1, wherein from a cross sectional view:
the first semiconductor substrate is of a third horizontal dimension greater than the first horizontal dimension of the first bonding layer; and
the fourth horizontal dimension of the second semiconductor substrate is greater than a second horizontal dimension of the second bonding layer.

7. The apparatus of claim 1, wherein:
the first bonding layer is of a length from about 11 um to about 200 um from a cross section view.

8. The apparatus of claim 1, wherein:
the second bonding layer is of a length from about 10 um to about 199 um from a cross section view.

9. A device comprising:
a first semiconductor substrate;
a first bonding layer deposited on a bonding side of the first semiconductor substrate, wherein there is a gap between an edge of the first bonding layer and an edge of the first semiconductor substrate;
a second semiconductor substrate stacked on top of the first semiconductor substrate; and
a second bonding layer deposited on a bonding side of the second semiconductor substrate, wherein a horizontal dimension of the first bonding layer is greater than a horizontal dimension of the second semiconductor substrate by a first percentage.

10. The device of claim 9, wherein:
the first percentage is in a range from about 20% to about 40%.

11. The device of claim 9, wherein:
a first edge of the second semiconductor substrate and a first edge of the second bonding layer are separated by a first distance; and
a second edge of the second semiconductor substrate and a second edge of the second bonding layer are separated by a second distance.

12. The device of claim 11, wherein:
the first distance is less than 10 um; and
the second distance is less than 10 um.

13. The device of claim 9, wherein:
the first semiconductor substrate is of a horizontal dimension greater than the horizontal dimension of the first bonding layer; and
the horizontal dimension of the second semiconductor substrate is greater than a horizontal dimension of the second bonding layer.

14. The device of claim 9, further comprising:
a first barrier layer formed on a first side of the first bonding layer; and
a second barrier layer formed on a second side of the first bonding layer, wherein the first barrier layer and the second barrier layer are formed on a same material as the first bonding layer.

* * * * *